United States Patent [19]

Noguchi

[11] Patent Number: 5,343,434

[45] Date of Patent: Aug. 30, 1994

[54] NONVOLATILE SEMICONDUCTOR MEMORY DEVICE AND MANUFACTURING METHOD AND TESTING METHOD THEREOF

[75] Inventor: Kenji Noguchi, Hyogo, Japan

[73] Assignee: Mitsubishi Denki Kabushiki Kaisha, Tokyo, Japan

[21] Appl. No.: 4,030

[22] Filed: Jan. 15, 1993

[30] Foreign Application Priority Data

Apr. 2, 1992 [JP] Japan ................................ 4-080973

[51] Int. Cl.⁵ .......................................... G11C 16/06
[52] U.S. Cl. .................................. 365/218; 265/185; 265/201; 265/900
[58] Field of Search ............... 365/185, 104, 218, 900, 365/96, 201

[56] References Cited

U.S. PATENT DOCUMENTS 4,519,050  5/1985  Folmsbee ............................ 365/53
5,237,535  8/1993  Mielke et al. ....................... 365/218

FOREIGN PATENT DOCUMENTS 2-10596  1/1990  Japan .
2-10598  1/1990  Japan .

*Primary Examiner*—Joseph A. Popek
*Attorney, Agent, or Firm*—Lowe, Price, LeBlanc & Becker

[57] ABSTRACT

In a memory device in a bare chip state which is determined as fail by over erasing during a test at a wafer level, information indicating the presence of an over-erased memory cell is stored in a nonvolatile and readable manner into an identification memory circuit, and then memory cells in a memory cell array are restored to an erase state of an electrically neutral state by irradiation with an energy beam such as ultraviolet rays. A chip erased by the energy beam such as ultraviolet rays is assembled as an OTPROM (one-time programmable read only memory) and tested. At that time, a writing-/erasing control circuit for controlling data writing into and data erasing in the memory cells is brought into an operation inhibited state in accordance with the information stored in the memory circuit. It is possible to reduce the rate at which fail products are produced by use of a flash memory which is determined as fail because of the presence of an over-erased memory cell as a one-time programmable memory device.

8 Claims, 11 Drawing Sheets

NONVOLATILE SEMICONDUCTOR MEMORY DEVICE AND MANUFACTURING METHOD AND TESTING METHOD THEREOF

BACKGROUND OF THE INVENTION

1. Field of the Invention

The present invention relates generally to nonvolatile semiconductor memory devices and, more particularly, to an electrically programmable and erasable read only memory. The invention relates more specifically to a flash memory including memory cells each comprised of one floating gate type transistor.

2. Description of the Background Art

One of semiconductor memory devices for storing information therein in a nonvolatile manner is called a flash memory. In the flash memory, all memory cells in a memory array are simultaneously put in an erase state during an erasing mode.

FIG. 9 is a diagram schematically showing a cross-sectional structure of one memory cell in a flash memory. With reference to FIG. 9, the memory cell includes n type impurity regions 102 and 104 formed on a surface of a p type semiconductor substrate 100, a floating gate 106 formed on a channel region 112 between the impurity regions 102 and 104 with a gate insulating film 110 interposed between the channel region and the floating gate, and a control gate 108 formed on the floating gate 106 with an interlayer insulation film 114 interposed therebetween. The floating gate 106 has its peripheries surrounded by the insulating films 110 and 114 and is brought into an electrically floating state. This memory cell has a structure of a MOS (Metal-Insulator-Semiconductor) transistor, in which the impurity regions 102 and 104 constitute a drain region and a source region, respectively.

FIG. 10 is a diagram showing an electrically equivalent circuit of the memory cell shown in FIG. 9. The control gate 108 has an electrode CG connected to a word line WL, and the impurity region 102 has a drain electrode D connected to a bit line BL. The impurity region 104 has its source electrode normally coupled via a source line S to a source potential generating circuit 116.

In the flash memory, memory cells of this type are arranged in rows and columns, and memory cells of one row are connected to a single word line WL, while memory cells of one column are provided on a single bit line BL. Data writing, erasing and reading with respect to the memory cell shown in FIGS. 9 and 10 are carried out as follows.

In writing, a high voltage Vpp of approximately 12 V is applied via the word line WL to the control gate 108, a voltage of approximately 6 V is applied via the bit line BL to the drain impurity region 102, and a ground potential is applied to the source impurity region 104 by the source potential generating circuit 116. In this state, a current flows from the drain impurity region 102 through the channel region 112 to the source impurity region 104. Charges in the current flowing from the drain impurity region 102 are excited by a high electric field formed near the drain impurity region 102, so that hot electrons are generated. The generated hot electrons cause avalanche breakdown, thereby generating a large amount of hot electrons. The hot electrons generated by the avalanche breakdown are accelerated to the floating gate 106 by the high voltage applied to the control gate 108 and are then trapped in the floating gate 106. In such a state that electrons are injected (trapped) into the floating gate 106, a threshold voltage Vth of this memory cell shifts in a positive direction.

In erasing, a ground potential is applied to the control gate 108, a high voltage Vpp of approximately 12 V is applied from the source potential generating circuit to the source impurity region 104, and the drain impurity region 102 is brought into a floating state. In this state, electrons are drawn out from the floating gate 106 through the gate insulating film 110 (very thin) to the source impurity region 104 due to a tunneling phenomenon. With the electrons drawn out from the floating gate 106, a threshold voltage Vth of this memory cell shifts in a negative direction.

As described above, the memory cell stores data "0" and "1" therein in accordance with the amount of electrons existing in the floating gate 106.

That is, as shown in FIG. 11, in the state where electrons are injected into the floating gate 106 (programmed state), its threshold voltage Vth shifts in the positive direction and the memory cell has a threshold voltage of Vr2. In the erase state where electrons are drawn out from the floating gate 106, its threshold voltage shifts in the negative direction and the memory cell has a threshold voltage Vr1. Normally, the programmed state where electrons are injected into the floating gate 106 is defined as a state where data "0" is stored, and the erase state where electrons are drawn out from the floating gate 106 is defined as a state where data "1" is stored.

In data reading, a ground potential is applied to the source impurity region 104, and a signal of a logic high level or "H" level which is approximately the same level as a supply voltage Vcc is transmitted via the word line WL to the control gate 108. In this state, this memory cell is in an OFF state when the memory cell stores data "0" therein, while the memory cell is an ON state when it stores data "1" therein. The bit line BL is supplied with a read potential, and data reading is carried out with a current driven sense amplifier detecting if a current flows in accordance with storage data of the memory cell.

With the memory cell thus structured, since data is stored in accordance with the amount of electrons existing in the floating gate 106, electrons are preserved in the floating gate 106 even if a power source is turned off. This enables a nonvolatile storage of information, and such a nonvolatile memory cell is utilized in various fields.

FIG. 12 is a diagram showing an overall structure of a conventional nonvolatile semiconductor memory device (flash memory), which is disclosed in, for example, Japanese Patent Laying-Open No. 2-10596. With reference to FIG. 12, a nonvolatile semiconductor memory device 200 includes a memory cell array 13 in which the memory cells having the structure shown in FIG. 9 are arranged in rows and columns. The nonvolatile semiconductor memory device 200 further includes an address latch 10 for latching applied address bits A0–Am to generate internal address bits, an X decoder 12 for decoding internal row address bits from the address latch 10 to select one row of the memory cell array 13, a Y decoder 11 for decoding internal column address bits from the address latch 10 to generate a column selecting signal for selecting a corresponding column of the memory cell array 13, and a Y gate circuit 14 which responds to the column selecting signal from the Y decoder 11 to connect a corresponding column of the memory cell array 13 to an internal data bus 123b or a data latch 15.

In this nonvolatile semiconductor memory device, data input/output is carried out in the units of 8 bits (one byte). Thus, the column selecting signal from the Y decoder 11 designates 8 columns in the memory cell array 13, and the Y gate circuit 14 responds to this column selecting signal to connect 8 columns to the internal data bus 123b or the data latch 15.

The nonvolatile semiconductor memory device 200 further includes an input/output buffer 6 coupled to an 8-bit bidirectional data bus 120, and a sensing circuit 7 for detecting the presence/absence of a current on the internal data bus 123 and reading memory cell data. An output of the sensing circuit 7 is transmitted to an output buffer included in the input/output buffer 6 and is then output as read data onto the data bus 120. In data writing (programming), the input/output buffer 6 generates internal data from data D0-D7 applied to the data bus 120 and applies the generated internal data via a data bus 123a to the data latch 15.

The nonvolatile semiconductor memory device 200 further includes, in order to execute erasing and programming of memory cell data, an instruction port controller 2 for generating various control signals in response to a write enable signal /WE, a chip enable signal /CE and a program high voltage Vpp, an erase voltage generating circuit 5 which responds to a control signal from the instruction port controller 2 to generate an erase voltage from the program high voltage Vpp and applies the generated erase voltage (a high voltage of approximately 12 V during an erasing operation) to respective sources of the memory cells in the memory cell array 13, a program voltage generating circuit 4 which responds to a control signal from the instruction port controller 2 to receive the program high voltage Vpp and generates and applies a program voltage to the Y decoder 11 and the X decoder 12, a CE /OE logic circuit 8 for controlling a data input/output operation of the input/output buffer 6 in response to the chip enable signal /CE and an output enable signal /OE, and an erase/program verification generating circuit 9 for generating a verify voltage during erasing/programming in response to a control signal from the instruction port controller 2.

The voltage output from the erase/program verification generating circuit 9 is applied to the X decoder 12, and during an erase/program verifying operation, the output voltage is transmitted via the X decoder 12 onto a selected word line in the memory cell array 13.

The instruction port controller 2 receives data applied from the input/output buffer 6 as an operation instructing signal in accordance with a combination of the states of the write enable signal /WE and the chip enable signal /CE, then decodes the received instruction signal and generates a necessary control signal. The instruction port controller 2 is rendered operative when the externally applied program high voltage Vpp is at a high voltage value of 12 V, while it is rendered inoperative when this program voltage Vpp is at a normal operation supply voltage level of 5 V. Instructions that can be decoded by the instruction port controller 2 are of $2^n$ types (n is the number of data bits applied via the data bus 120).

This nonvolatile semiconductor memory device 200 externally receives an operating supply voltage Vcc of normally approximately 5 V, a potential Vss normally at a ground potential level, and a program high voltage Vpp. When the chip enable signal /CE attains a logic low level, this nonvolatile semiconductor memory device 200 is selected and executes a designated operation. That is, the instruction port controller 2 responds to the chip enable signal /CE of a low level to be ready to receive an instruction from the input/output buffer 6. The instruction port controller 2 receives the instruction from the input/output buffer 6 via the signal line 123a at a rising edge of the write enable signal /WE from a low level to a high level, and decodes the received instruction. When the program high voltage Vpp is 5 V, the instruction port controller 2 is rendered inoperative, and the nonvolatile semiconductor memory device 200 operates constantly only in a data reading mode.

Each of the data latch 15 and the address latch 10 responds to a strobe signal STB from the instruction port controller 2 to latch an applied signal in a program mode.

FIG. 13 is a block diagram showing structure of the instruction port controller shown in FIG. 12. With reference to FIG. 13, the instruction port controller 2 includes a WE·CE control logic circuit 231 which is activated in response to a low level of the chip enable signal /CE and generates an internal write enable signal CWE in accordance with the write enable signal /WE, an address clock generator 232 which is activated in response to the chip enable signal /CE and applies a latch timing signal STB to the address latch 10 shown in FIG. 12 in accordance with the internal write enable signal CWE, a status clock generator 233 for generating a clock signal in response to the internal write enable signal CWE, a status register 235 which responds to a clock signal from the status clock generator 233 to store therein, as an instruction code, data transmitted from the input/output buffer 6 onto the internal data bus 123a, and a clock generator 234 which is activated in response to an output signal from the status register 235 and generates an instruction clock signal and a data clock signal in response to the internal write enable signal CWE.

The clock generator 234 includes a data clock generator 234b for generating a strobe signal STB for providing data latch timing of a data latch (see FIG. 12), and an instruction clock generator 234a for generating an instruction clock signal for providing timing at which an instruction register 237 receives data on a data bus 223a as an instruction code.

The instruction port controller 2 further includes a status decoder 236 which decodes the instruction codes stored in the status register 235 and the instruction register 237, generates signals for controlling the operation of the erase voltage generator, the program voltage generator and the erase/program verification generator of FIG. 12 and also defines the operation of the address clock generator 232 and the status register 235.

An operation mode is designated by data applied via the data bus 123a in a write cycle which in turn is determined by the write enable signal /WE and the chip enable signal /CE. When the chip enable signal /CE attains a logic low level, the address clock generator 232 responds to a rising edge of the write enable signal /WE (i.e., a rising edge of the internal write enable signal CWE) to generate and apply an address strobe signal STB to the address latch 10 shown in FIG. 12. The address latch 10 responds to the applied address strobe signal STB to be brought into a latch state and latches an applied address.

At the rising edge of the write enable signal /WE, data is latched into the status register 235 and the instruction register 237 or the status register 235 and the data latch 15. The status decoder 236 decodes the data stored in the status register 235 and the instruction register 237 and drives corresponding circuits.

In an erasing mode, the erase voltage generator 5 responds to an output of the status decoder 236 to generate a program high voltage Vpp and applies the same to a source of each memory cell in the memory cell array 13.

The program voltage generator 4 selects the program high voltage Vpp in response to the output of the status decoder 236 in a programming mode (data writing) and applies the selected voltage to the X decoder 12 and the Y decoder 11. Accordingly, a column selecting signal and a word line driving signal from the Y decoder 11 and the X decoder 12 attain a high voltage Vpp level. In program verifying and erase verifying, the erase/program verification generating circuit 9 generates a verify voltage from the program high voltage Vpp and applies the same to the X decoder 12 in order to verify if programming is correctly made and erasing is executed. An operation will now be described.

In data reading, the chip enable signal /CE and the output enable signal /OE attain a low level, so that the CE /OE logic circuit 8 is activated. At that time, the CE /OE logic circuit 8 drives the output buffer included in the input/output buffer 6 at predetermined timing. The address latch 10 allows the applied address bits A0-Am to pass without being latched and generates internal address bits. The X decoder 12 and the Y decoder 11 decode the applied internal address bits and generate signals for selecting a row and a column of the memory cell array 13. In a reading mode, normally, selecting signals output from the X decoder 12 and the Y decoder 11 are at an operating supply voltage Vcc level. Data of selected memory cells in the memory cell array 13 are transmitted via the Y gate circuit 14 to the data bus 123b. The sensing circuit 7 reads memory cell data in response to the result as to whether or not a current flows through the data bus 123b, and applies the read data to the output buffer included in the input/output buffer 6. The output buffer generates external read data from the data read from the sensing circuit 7 under control by the CE /OE logic circuit 8 and transmits the generated external read data onto the 8-bit bidirectional data bus 120.

The erasing mode includes two cycles. In the first cycle, an erase code is written into the instruction register 237 and the status register 235. In the second cycle, an erase verify code is written into the status register 235. An erasing operation is started immediately after the erase verify code is written into the status register 235. The status decoder 236 first applies a control signal to the erase voltage generator 5 and applies a high voltage Vpp of 12 V from the erase voltage generator 5 to the respective sources of all the memory cells in the memory cell array 13, and the decoder 236 also sets all the outputs of the X decoder 12 at a ground potential. Accordingly, a high electric field is produced between the control gate and the source of each memory cell, and electrons stored in the floating gate are drawn to the source line in the form of a tunneling current.

Then, when an erase verifying code is written into the status register 235 and the instruction register 237, this erasing operation is ended and an address indicating the location of a memory cell to be verified is latched. Thus, the address strobe signal STB is generated from the address clock generator 232. The erase/program verification generator 9 generates an erase verify voltage from the program high voltage Vpp and applies the generated voltage to the X decoder 12.

The X decoder 12 transmits this erase verify voltage onto the word line. The Y decoder 11 connects a corresponding column in the memory cell array 13 via the Y gate circuit 14 to the data bus 123b. A threshold voltage of an erased memory cell is lower than the erase verify voltage, and an addressed memory cell is put in an ON state, so that data "1" is read in a normal case. Data of the addressed memory cell can be read via the input/output buffer 6 by an external device if the output enable signal OE is fallen to a low level. The external device is then able to determine in accordance with the read data whether or not the data of the memory cell is erased. This erase verifying operation is carried out for all addresses.

A programming operation includes two cycles similarly to the erasing operation. In the first cycle, a program instruction code is stored in the status register 235 and the instruction register 237. In the second cycle, the address latch 10 and the data latch 15 are brought into a latch state, so that the address bits A0-Am and program data are latched in the address latch 10 and the data latch 15, respectively. In the second cycle, when the write enable signal /WE rises, the status decoder 236 decodes instructions stored in the status register 235 and the instruction register 237, then applies a control signal to the program voltage generator 4 and starts programming.

The program voltage generator 4 responds to a signal from the instruction port controller 2 (the status decoder 236) to apply the program high voltage Vpp to the X decoder 12 and the Y decoder 11. The X decoder 12 and the Y decoder 11 decode the internal address bits latched in the address latch 10, then transmits a high voltage of the program high voltage Vpp level onto a corresponding word line in the memory cell array 13 and also applies a column selecting signal to the Y gate circuit 14. The data latch 15 transmits onto a bit line a write high voltage corresponding to data "0" Accordingly, a high voltage is applied to the control gate and the drain of the addressed memory cell, electrons are injected into the floating gate, and the data "0" is written.

Then, the programming is ended by writing a program verify instruction into the status register 235 and the instruction register 237, and an internal verify voltage for verifying data of a newly programmed memory cell is generated. The program verify voltage generated from the erase/program verification generator 9 is transmitted via the X decoder 12 onto a selected word line in the memory cell array 13. Data of the addressed memory cell of the memory cell array 13 is transmitted via the Y gate circuit 14 to the sensing circuit 7, and the transmitted data is detected and amplified by the sensing circuit 7 and then transmitted to the output buffer included in the input/output buffer 6.

With the output enable signal /OE set at a low level, the CE /OE logic circuit 8 activates the output buffer included in the input/output buffer 6 which transmits the data from the sensing circuit 7 onto the data bus 120. It is determined externally if data on the data bus 120 matches or mismatches the program data, and a determination is made as to whether data writing (programming) is carried out accurately. If the accurate programming is not made, then the program cycle is again executed and a programming is again carried out. A more detailed description will now be made on this erasing operation and the programming operation.

FIG. 14 is a flow chart showing the erasing operation of this nonvolatile semiconductor memory device. First, at the stage of initializing, a program high voltage Vpp is applied to the instruction port controller 2 to render the instruction port controller 2 operative (a step S2). Then, specific data (00H) is programmed for all bytes (data input/output is carried out in the units of byte and erasing is carried out also in the units of byte) (a step S4). This data programming is made in order to bring each memory cell into a write state and set the threshold voltage of each memory cell to be substantially equal. In addition, each counter is preset to a predetermined initial value (a step S6). This counter includes a counter for counting the number of time CUMTEW of the increase of an erase pulse width TEW, and a counter for counting the number of times PLSCNT by which erase pulses are generated. An address is set to 0.

Then, an erase setup instruction is written into the instruction port controller 2 (the status register 235 and the instruction register 237) (a step S8), and an erase instruction is subsequently written into the instruction port controller 2 (a step S10). An erasing with respect to all the memory cells is executed in accordance with the writing of the erase instruction (a step S12). After a predetermined time period has passed, it is determined that the erasing of the memory cells is completed, and an erase verify instruction is written into the instruction port controller 2 (the status register 235 and the instruction register 237) (a step S14). In accordance with this erase verify instruction, an erase verify voltage is generated from the erase/program verification generator 9 and then transmitted via the X decoder 12 onto a selected word line in the memory cell array (a step S16). When a predetermined time period has passed (time T2), data reading is carried out (a step S18).

If the read data is an erased data, then the data is "1". If the read data is an unerased data, then the data is "0". A determination is made as to whether this data is in the erased state or not in accordance with its value (a step S20). If the data indicates the unerased state, then an erase pulse width to be applied to erase the data is incremented by a predetermined value, and this incremented erase pulse width information is stored in the TEW counter (a step S22). A determination is first made as to whether the erase pulse width stored in the TEW counter reaches a maximum limit value, and subsequently, a determination is made as to whether the number by which the erase pulses are applied reaches a predetermined value (64 times) (a step S24). When the erase pulse application number PLSCNT reaches the predetermined value (64 times), it is determined that no erasing is allowed for that memory cell any more, and an erase error is stored (a step S26). When the erase pulse application number PLSCNT does not reach the predetermined value in the step S24, the processing returns to the step S8, in which the writing and erasing operation by the erase setup instruction and the erase instruction is carried out.

If the memory cell data is erased in the step S20, a determination is made as to whether the address of the memory cell is a final address (a step S28). If the address is not the final address, then the address is incremented (a step S30), and the processing returns to the step S14. That is, erase verifying is made in accordance with the incremented address. If the data of the memory cell in the final address is verified in the step S28, then a read instruction is written into the status register 235 and the instruction register 237 in order to reset the registers 235 and 237 (a step S32), and the erase cycle is ended.

As described above, in the erase cycle, if the memory cell data is unerased, then the erase pulse width TEW is incremented and an erasing sequence is repeated. A verification sequence is started from a final unerased memory cell.

FIG. 15 is a flow chart showing an operation during programming. A description will now be made on a programming operation of the nonvolatile semiconductor memory device with reference to FIGS. 12, 13 and 15.

A programming cycle is started by external application of a high voltage Vpp of 12 V (a step S52) and initialization of the pulse counter.

Then, a program setup instruction is written into the instruction register 237 and the status register 235 (a step S54), and external address bits A0-Am and data are subsequently latched (a step S56). After the data and address are latched, data writing into an addressed memory cell is carried out under control by the instruction port controller 2. When a predetermined time period T1 has passed (a step S58), a program verify instruction is written into the instruction register 237 and the status register 235 (a step S60). A program verify voltage is generated from the erase/program verification generator 9 in accordance with the program verify instruction and then applied via the X decoder 12 onto a word line connecting the addressed memory cell. After a predetermined time period (T2) has passed (a step S62), data is read from the addressed memory cell in order to verify the programmed data (a step S64).

The data reading is realized by falling of the output enable signal /OE to a low level. A determination is made as to whether the read data is equal to the program data (a step S66). If they are not equal to each other, the pulse count PLSCNT is incremented to extend a program time, and a determination is made as to whether this pulse number PLSCNT is a predetermined value (23). If the pulse number is lower than the predetermined value, the processing returns to the step S54, and the program sequence is again executed (a step S68).

If the pulse number PLSCNT does not reach the predetermined value (23) in the step S68, it is determined that the memory cell is unprogrammable, and a program error is stored (a step S70). That is, repetitive applying of pulses of a predetermined width up to the times of a maximum count value of 25 causes extension of the programming time. When this programming time reaches a predetermined value, a program error of the nonvolatile semiconductor memory device is detected.

If the read data and the program data match each other in the step S66, it is determined whether to program another byte data (a step S72). If it is determined that data should be written into another byte in the step S72, the next address is latched, and a program sequence from the step S52 is repeated (a step S74). If a final address of the memory cell to be programmed is reached in the step S72, then a read instruction is written into the status register 235 and the instruction register 237 to bring both registers 235 and 237 in a reset state.

The programming sequence shown in FIG. 15 is utilized also as an operation sequence (for the step S4) in which data "00H" is written into all the memory cells in the erase sequence shown in FIG. 14, so as to bring all the memory cells in a programmed state and adjust their threshold voltages.

In the nonvolatile semiconductor memory device as described above, erasing of memory cell data is made by electrically drawing electrons from the floating gate by a tunneling current. In this case, as shown in FIG. 16, electrons are excessively drawn out from the floating gate 106, so that such a state appears that the floating gate 106 is charged positively. This state is called an over-erase state. In the over-erase state, the positive charges stored in the floating gate 106 cause electrons to be attracted to the surface of the channel region 112. Even if the control gate 108 is held at a ground potential, this channel region 112 appears and the memory cells are always in an ON state (depletion state) as shown by broken lines in FIG. 11.

Usually, in order to prevent such an over-erase state, the data "00H" is written into all the memory cells at the initial stage of the erase cycle and their threshold voltages are equally set to a sufficiently large value. The erasing operation is thereafter carried out. When un-erased memory cells are detected in the erase cycle, however, erase pulses are applied to all the memory cells and the erase sequence is repeated. Thus, since an erase voltage is also applied to erased memory cells, the over-erase state inevitably occurs. Problems of such over-erased memory cells will now be described with reference to FIG. 17.

In FIG. 17, memory cells MC1, MC2 and MC3 provided at intersections of three word lines WL1, WL2 and WL3 and a single bit line BL are shown only for the purpose of illustration. Assume that the memory cell MC1 stores data "1" in the erase state, the memory cell MC2 is in the over-erase state, and the memory cell MC3 stores data "0" in the program state. A case is now considered where storage data "1" of the memory cell MC1 is read. In this case, a potential of the word line WL1 rises to a logic high level, and the word lines WL2 and WL3 are at a ground potential. In this case, since the memory cell MC1 stores data "1" therein and a current flows through the bit line BL, the data "1" is read. No problems occur in this state.

When the data of the memory cell MC3 is read, the potential of the word line WL3 is set at a logic high level, and the word lines WL1 and WL2 are held at the ground potential. In this case, the memory cell MC3 stores data "0" therein and is in an OFF state. Since the memory cell MC2 is in the over-erase state, however, a current flows from the bit line BL through this memory cell MC2 to a source S even if the potential of the word line WL2 is the ground potential. It is this determined that the memory cell MC3 is storing the data "1", and erroneous data reading is carried out. Accordingly, when there is any memory cell in the over-erase state, a problem occurs that data reading is not ensured.

Such a memory cell in the over-erase state is produced due to influences exerted by local effects in the memory array (i.e., the degree of a film thickness of a gate insulating film or the degree of capacitance coupling between the control gate 108 and the floating gate 106) even if the erase pulse application number is smaller. When there is such a memory cell in the over-erase state, since an accurate data programming and reading cannot be carried out even if other memory cells are in a normal state, the semiconductor memory device is disposed as a defective product, resulting in a decrease in the production yield of the semiconductor memory device.

SUMMARY OF THE INVENTION

One object of the present invention is to provide a nonvolatile semiconductor memory device in which a rate at which the semiconductor memory device is disposed as a defective product can be substantially reduced even if there is an over-erased memory cell.

Another object of the present invention is to provide a flash memory which can be utilized as a nonvolatile semiconductor memory device of another type even if there is an over-erased memory cell.

A further object of the present invention is to provide a method of manufacturing a nonvolatile semiconductor memory device in which a product rate at which the device is disposed as a defective product can be substantially reduced even if there is an over-erased memory cell.

A still further object of the present invention is to provide a testing method for discovering a nonvolatile semiconductor memory device which can be utilized as a nonvolatile semiconductor memory device of another type from a nonvolatile semiconductor memory device which is determined to be a defective product.

A nonvolatile semiconductor memory device according to the present invention includes: memory type storing circuitry for storing therein information indicating whether or not an over-erased memory cell existing in a memory cell array has been erased by irradiation with an energy beam; erasing/writing control circuitry for controlling an erasing and programming operation of data of a selected memory cell in the memory cell array; and memory type setting circuitry for setting the writing/erasing control circuitry in an operation prohibiting state or an operation enabling state in accordance with the information stored in the memory type storing circuitry.

A method of manufacturing a nonvolatile semiconductor memory device according to the present invention includes the steps of: determining if there is any over-erased memory cell in a bare chip state; assembling as a memory which is electrically programmable and erasable plural times when there is no over-erased memory cell; when there is an over-erased memory cell, irradiating a memory cell array portion of a chip with an energy beam so as to bring this memory cell array in an erased state; and assembling the chip as a one-time programmable memory after the irradiation with the energy beam.

A method of testing a nonvolatile semiconductor memory device according to the present invention includes the steps of: determining whether an over-erased memory cell exists or not in a memory cell array in a bare chip state; when there is no over-erased memory cell, assembling and testing this chip at a chip level as a memory which is erasable/programmable by plural times; when there is any over-erased memory cell, irradiating the memory cell array with an energy beam so as to bring memory cells of the memory cell array in an erase state; and assembling the chip irradiated with the energy beam and carrying out a test as a one-time writable read only memory at a chip level.

In the nonvolatile semiconductor memory device of the present invention, when there is an over-erased memory cell, erasing is carried out by irradiation with an energy beam, and its over-erase state is eliminated. This nonvolatile semiconductor memory device can be utilized as a memory device in which data can be written only once under control by an external circuit, with the operation of the writing/erasing control circuitry being prohibited.

In the manufacturing method of the nonvolatile semiconductor memory device, when there is any over-erased memory cell in a bare chip, all memory cells are erased by irradiation with an energy beam such as ultraviolet rays and then assembly is made, and hence, this nonvolatile semiconductor memory device can be utilized as a read only memory device which is programmable only once even if there is an over-erased memory cell.

In the testing method of the nonvolatile semiconductor memory device of the present invention, a memory device which can be utilized as a one-time programmable read only memory device is discriminated from fail products, and an operation test of this one-time programmable nonvolatile semiconductor memory device is carried out, while a final test is carried out for pass products in which there is no over-erased memory cell. This results in a substantial decrease in the number of nonvolatile semiconductor memory devices to be disposed as fail products.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
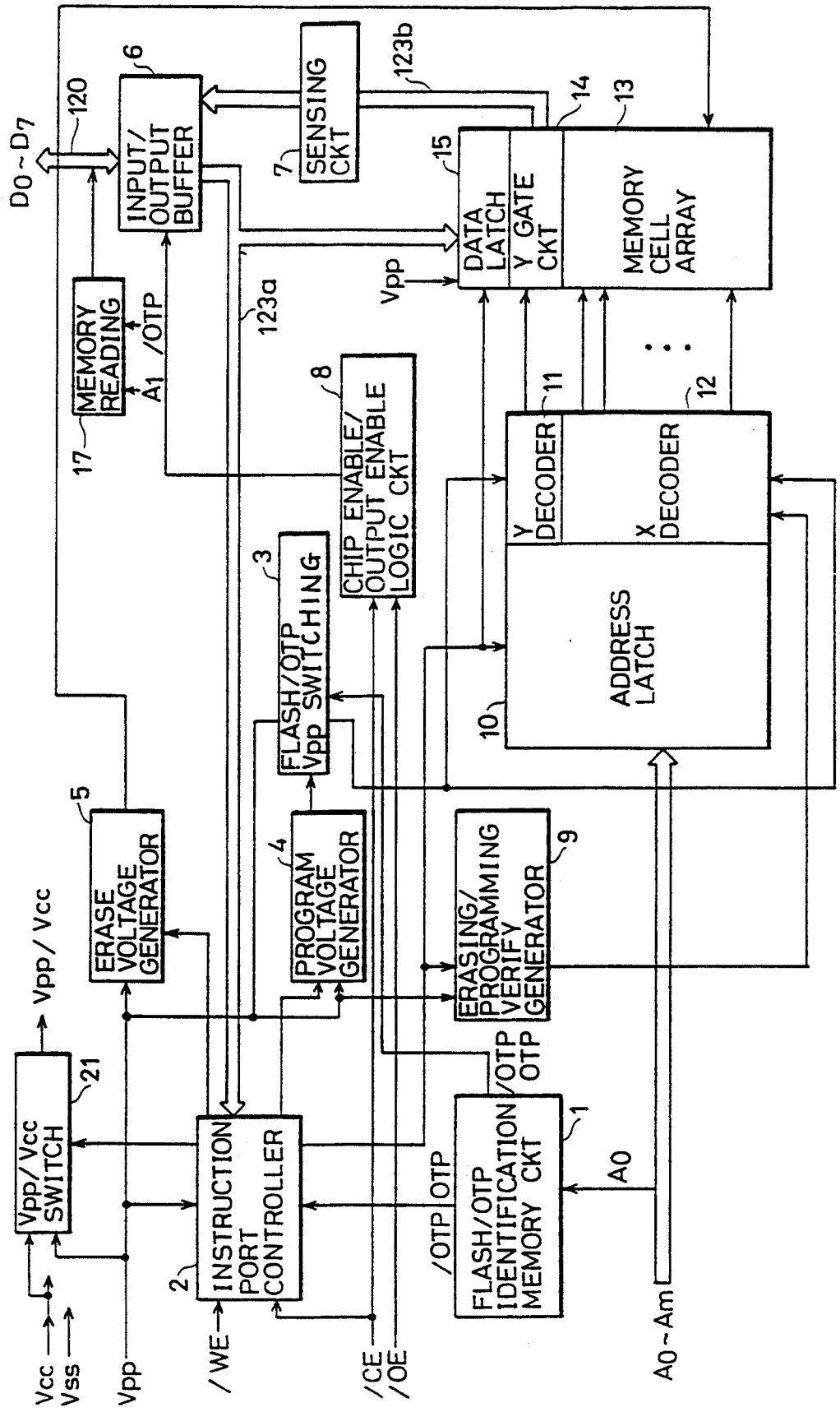
FIG. 1 is a diagram showing an overall structure of a nonvolatile semiconductor memory device according to one embodiment of the present invention.
Figure 12:
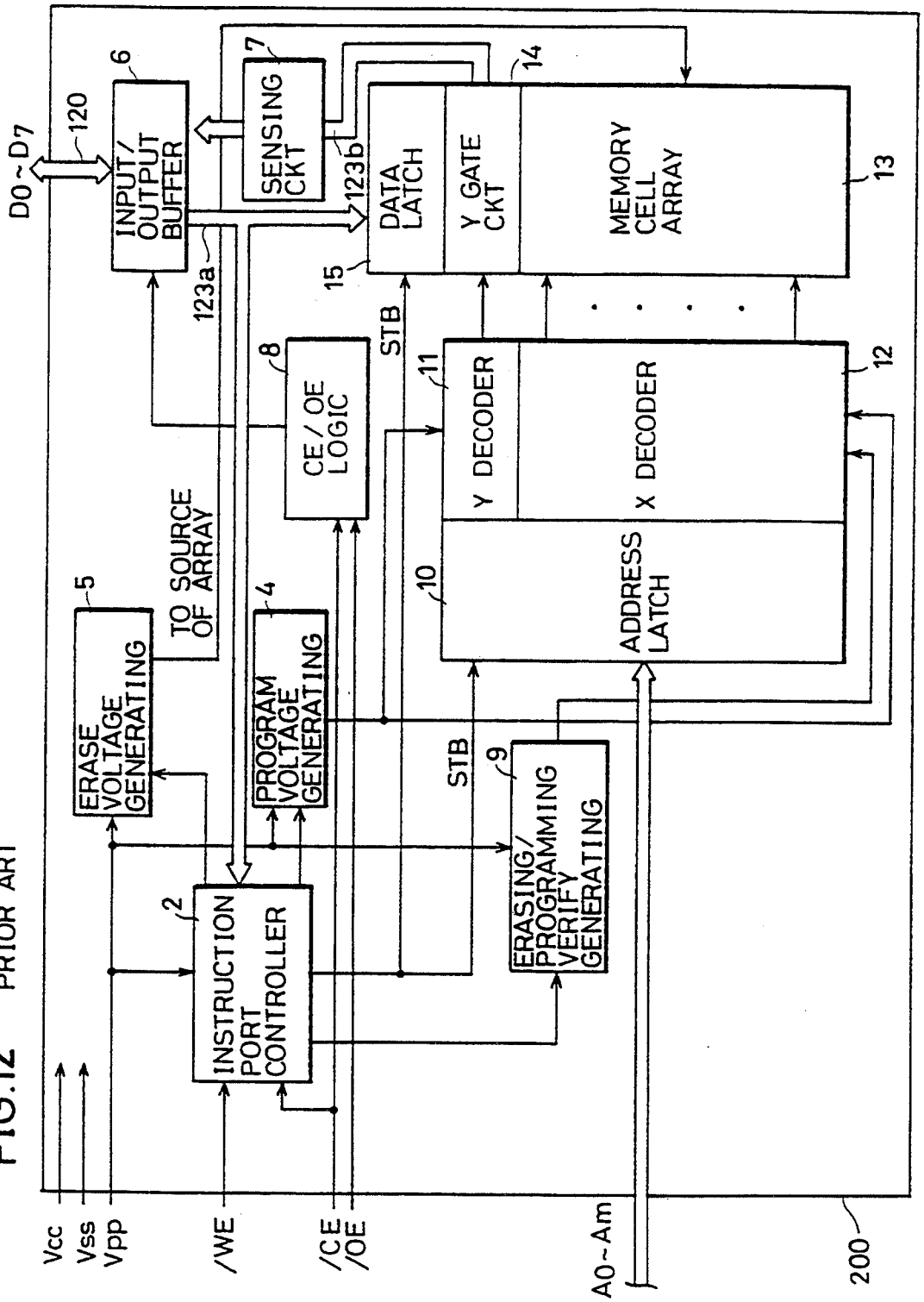
FIG. 12 is a block diagram schematically showing structure of a conventional nonvolatile semiconductor memory device.

FIG. 1 is a block diagram showing an overall structure of a nonvolatile semiconductor memory device according to one embodiment of the present invention. FIG. 1 shows a structure of a flash memory in which all memory cells in a memory cell array 13 are brought into an erase state at the same time. This structure corresponds to the structure of the conventional nonvolatile semiconductor memory device shown in FIG. 12. The structure of the memory device of the present invention is, however, applicable not only to the flash memory in which all memory cells of the memory cell array 13 are erased at the same time but also to a nonvolatile semiconductor memory device of the type in which erasing is made in units of a sector, a word line or a byte. Corresponding portions of the memory device of FIG. 1 to those of the conventional nonvolatile semiconductor memory device shown in FIG. 12 are denoted with the same reference numerals, and a detailed description thereof will not be repeated.

The nonvolatile semiconductor memory device of FIG. 1 according to one embodiment of the present invention includes a flash /OTP identification memory circuit 1 for storing, in a nonvolatile and readable manner, information as to whether this nonvolatile semiconductor memory device is a flash memory or a one-time programmable read only memory (hereinafter referred to as the OTPROM), a flash /OTP Vpp switching circuit 3 for switching a path along which a high voltage Vpp is generated during programming in accordance with storage information of the flash /OTP identification memory circuit 1, a memory reading circuit 17 for reading the storage information of the flash /OTP identification memory circuit 1 onto a data bus 120, and a Vpp/Vcc switch 21 for internally generating either a high voltage Vpp or a supply voltage Vcc in response to a control signal from an instruction port controller 2. This Vpp/Vcc switch 21 includes a charge pump circuit and internally generates the high voltage Vpp. Either the high voltage Vpp or the operation supply voltage Vcc is generated from the Vpp/Vcc switch 21 in accordance with its operation mode. (This is represented by Vpp/Vcc in FIG. 1).

Figure 13:
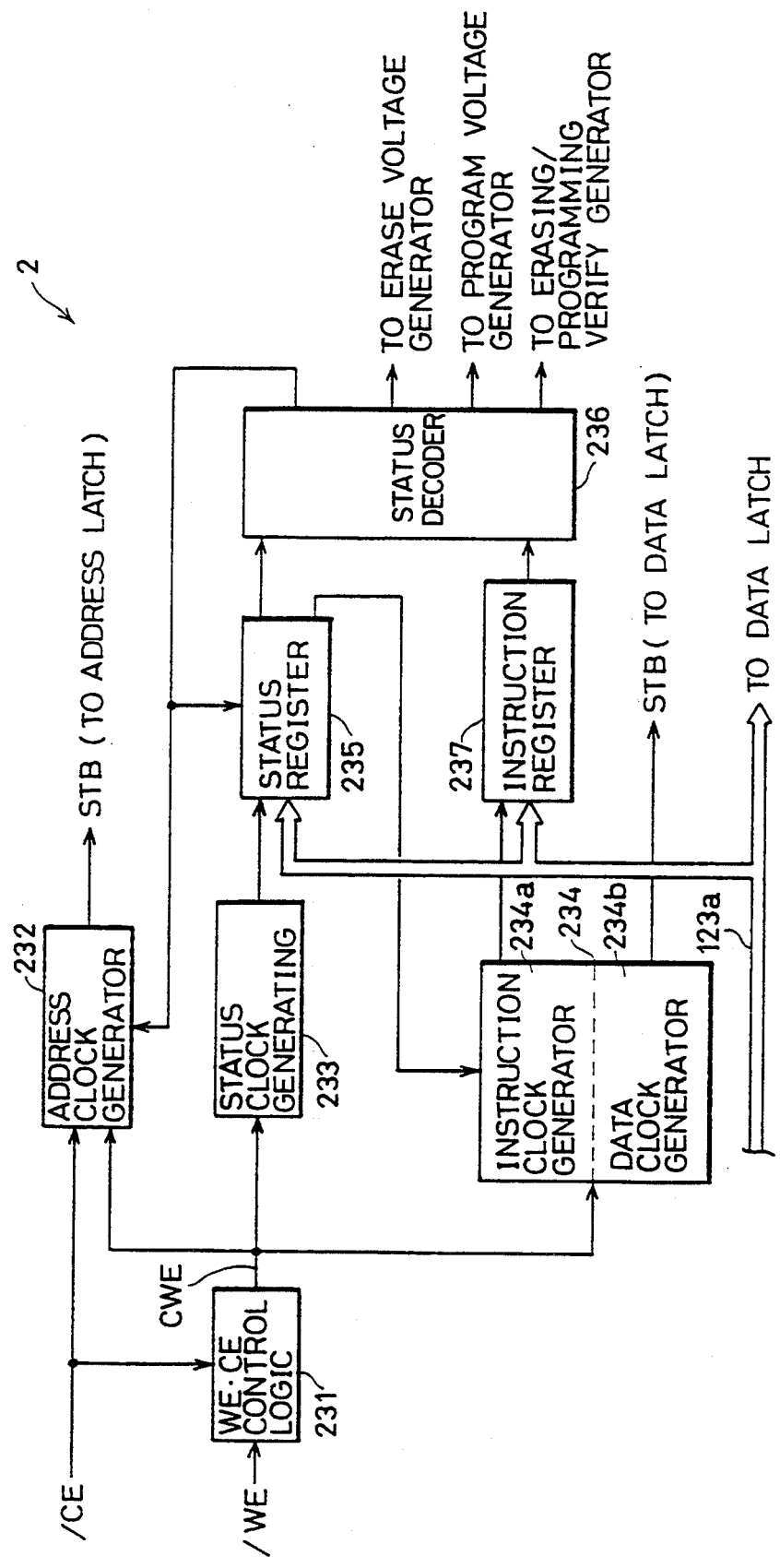
FIG. 13 is a diagram schematically showing structure of an instruction port controller shown in FIG. 12.

When this nonvolatile semiconductor memory device is brought into an over erase state during testing at a wafer level (bare chip state), an over-erased memory cell exists, and the memory device is put in an erase state by irradiation with an energy beam (ultraviolet rays are usually employed), the flash /OTP identification memory circuit 1 stores information indicating the above fact therein. When storing the information indicating the irradiation with the energy beam therein, the flash /OTP identification memory circuit 1 renders the instruction port controller 2 reset and prohibits erasing and writing control operations of the instruction port controller 2. More specifically, an output signal OTP and/or a signal /OTP from the flash /OTP identification memory circuit 1 is applied to the WE·CE control logic circuit 231 shown in FIG. 13, so that the WE /CE control logic circuit 231 is reset and an internal write enable signal CWE is fixed in an inactive state.

In this case, a structure may be employed in which a signal subjected to an OR operation of a signal OTP corresponding to storage information and a write enable signal /WE is applied to the WE·CE control logic circuit 231. Alternatively, another structure may be employed. When the storage information of the flash /OTP identification memory circuit 1 indicates the energy beam irradiation, the flash /OTP Vpp switching circuit 3 allows an applied high voltage Vpp to pass therethrough and be applied to a Y decoder 11 and an X decoder 12. On the other hand, when the storage information does not indicate the energy beam irradiation, the flash /OTP Vpp switching circuit 3 applies a program voltage from a program voltage generator 4 to the Y decoder 11 and the X decoder 12. A data latch 15 is supplied with an external high voltage Vpp. The other structure in this nonvolatile semiconductor memory device is the same as that of the conventional nonvolatile semiconductor memory device shown in FIG. 12.

When the Vpp/Vcc switch 21 is provided, even if a Vpp terminal of the switch 21 is erroneously opened, an internal operation supply voltage Vcc is generated by the Vpp/Vcc switch 21, and hence, the memory device operates as the OTPROM. When the memory device is utilized as a normal OTPROM, a 5 V voltage is applied to this Vpp input terminal.

Figure 2:
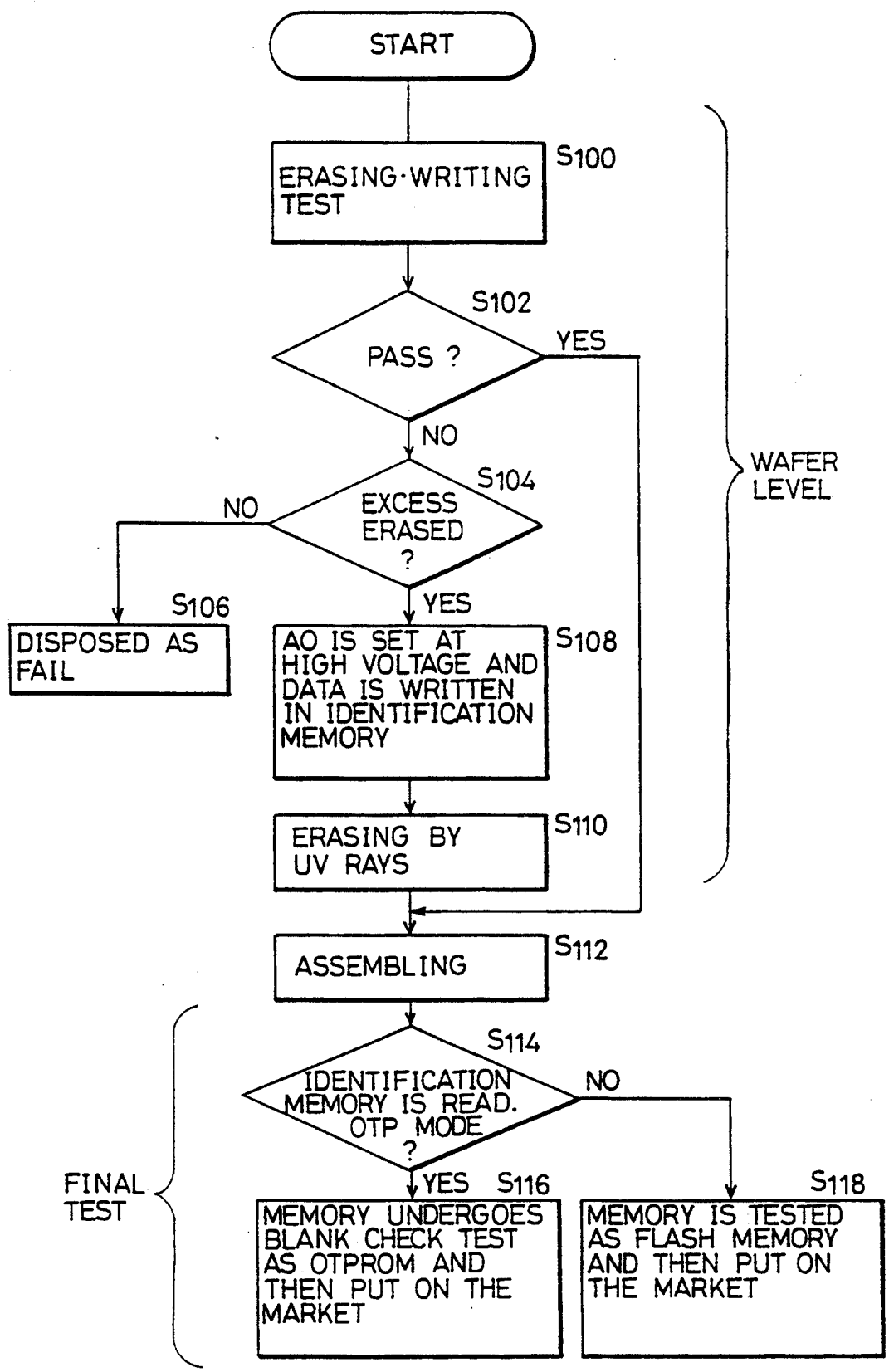
FIG. 2 is a flow chart showing the flow of manufacture of a nonvolatile semiconductor memory device of the present invention until the memory device is completed as a final product.

FIG. 2 is a flow chart showing the flow from time when the nonvolatile semiconductor memory device of FIG. 1 is manufactured to time when the manufactured device is put on market as a product. A description will now be given on the flow from the manufacture to the product of this nonvolatile semiconductor memory device with reference to FIGS. 1 and 2.

Figure 14:
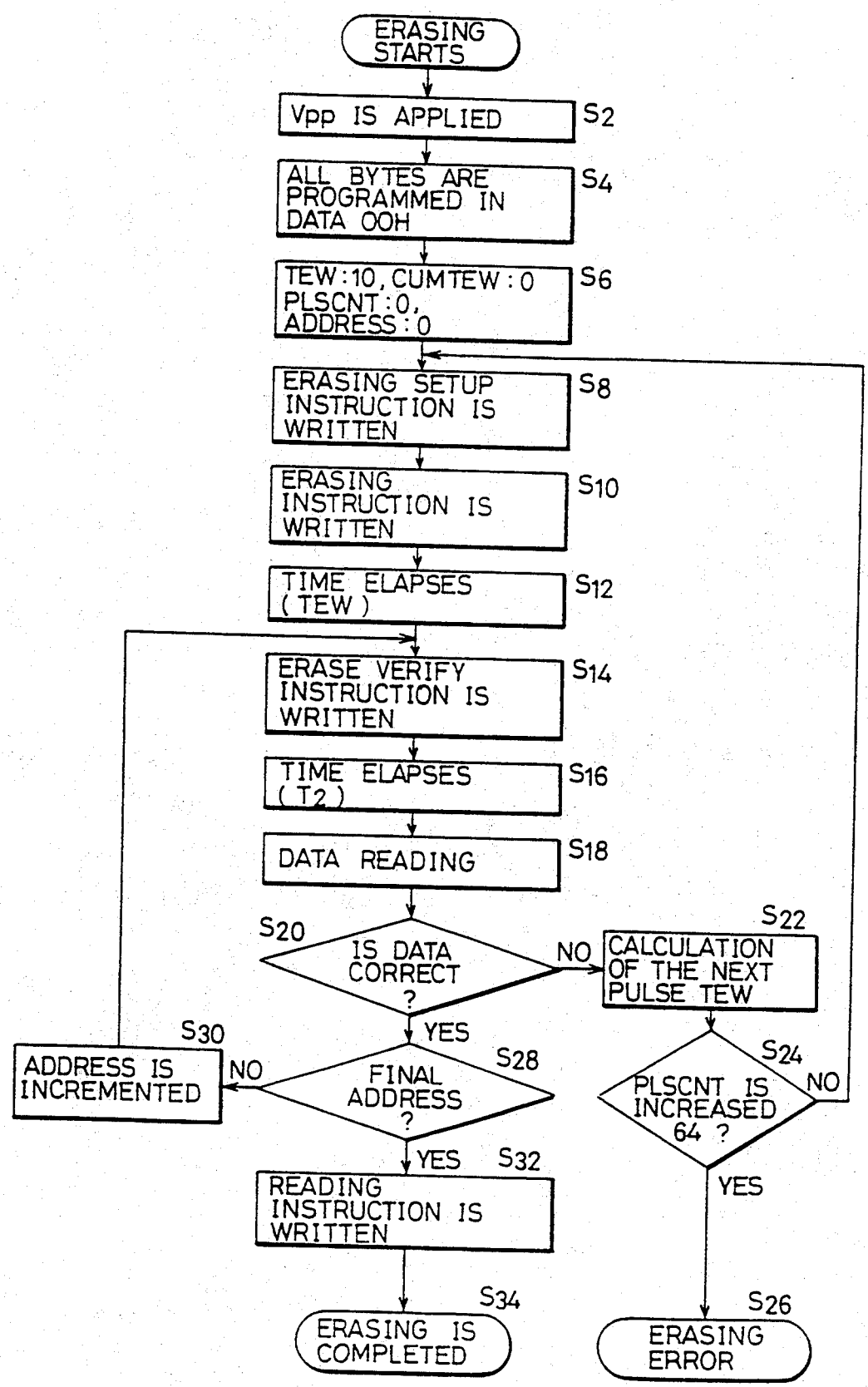
FIG. 14 is a flow chart showing an erasing operation in the conventional nonvolatile semiconductor memory device.
Figure 15:
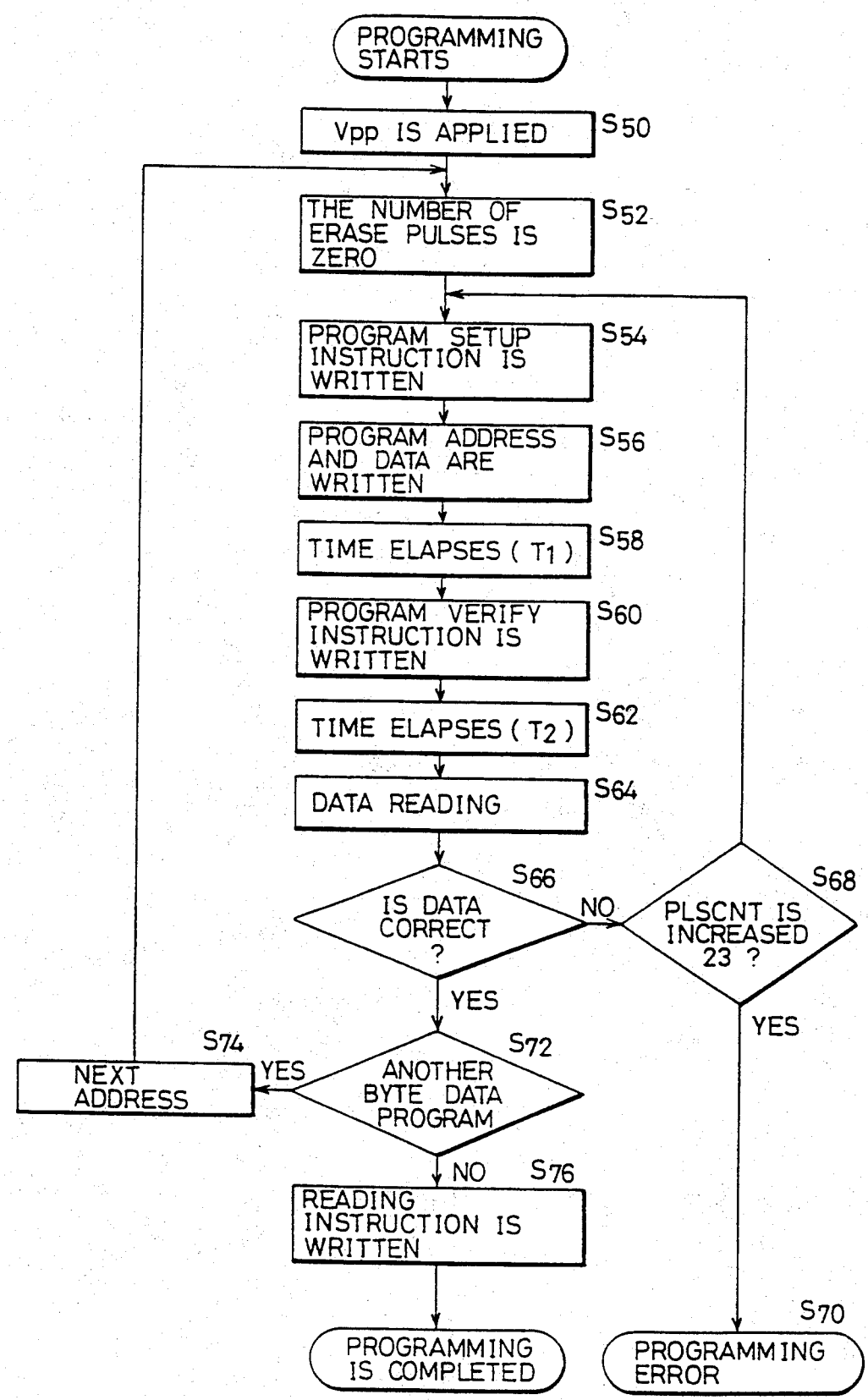
FIG. 15 is a flow chart showing a programming operation in the conventional nonvolatile semiconductor memory device.
Figure 16:
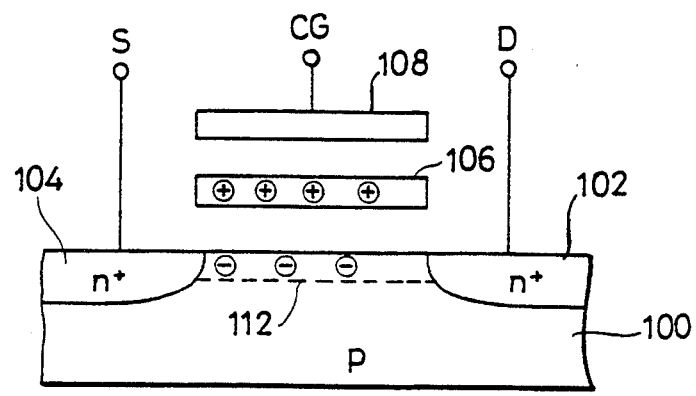
FIG. 16 is a diagram showing an example of the state of an over-erased memory cell in the conventional nonvolatile semiconductor memory device.
Figure 17:
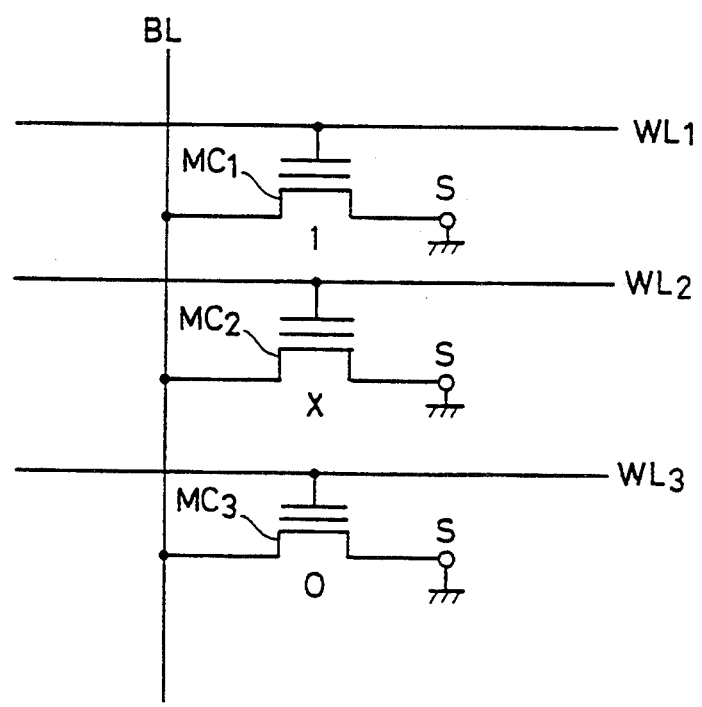
FIG. 17 is a diagram for use in explaining adverse influences exerted by an over-erased memory cell.

First, a test is carried out on the nonvolatile semiconductor memory device formed through a predetermined manufacture process as to whether the memory device normally operates at a wafer level, i.e., in a bare chip state in which the device is manufactured on semiconductor wafer (a step S100). In this case, an erasing test and a writing test are carried out in accordance with the flows shown in FIGS. 14 and 15 by operating the instruction port controller of FIG. 1 and by use of a predetermined testing jig. In this case, various types of test data patterns are provided via the input/output buffer 6, for testing an erasing characteristic, a writing characteristic and the like.

By conducting various tests at this wafer level, a determination is made as to pass/fail of the nonvolatile semiconductor memory device in the units of chip (a step S102). If the device is determined to be fail in the step S102, a determination is made as to whether a cause of the fail is due to over-erasing or not (a step S104). This determination as to the over-erasing or not is carried out by reading data in a state where all of outputs of the X decoder 12 are held at a ground potential and column selecting signals from the Y decoder 11 are sequentially brought into a selecting state. A test mode as to the over erasing or not is easily implemented by, for example, instructing an over erase test mode via the input/output buffer 6 to the instruction port controller 2 shown in FIG. 1.

When there is any over-erased memory cell, a current flows through the bit line BL and an output of the sensing circuit 7 is put in a data "1" state. By reading the output of the sensing circuit 7 from the input/output buffer 6 onto the data bus 120 with the signal /OE fallen to a low level, a determination is made as to whether there is any over-erased memory cell. If there is no over-erased memory cell, the read data are all "0", and in that case, it is determined that this chip is fail because of factors other than over erasing, so that this defective chip is disposed (a step S106).

On the other hand, if data "1" is read, it is determined that a cause of the defective chip is due to any over-erased memory cell when any other defective parts do not exist. In this case, with an address bit input terminal A0 set to a high voltage of approximately 10 V, data "0" is written into the flash /OTP identification memory circuit 1. The flash /OTP identification memory circuit 1 stores this data "0" therein in a nonvolatile and readable manner. (This structure will be described later in detail.)

After data "0" is written into the identification memory circuit 1 in a step S108, the memory array portion 13 of the chip which is determined to be fail due to the over-erased memory cell is irradiated with an energy beam, e.g., ultraviolet rays, so that all the memory cells in the memory cell array 13 are brought into a neutral erase state (a step S110).

After the erasing operation by the irradiation with ultraviolet rays, a chip on wafer (a bare chip: a chip which is not accommodated in a package) is diced and separated in the units of chip and then accommodated in the package (a step S112).

After the assembly in the step S112, a final test is carried out on this nonvolatile semiconductor memory device. That is, in a step S114, first, an address bit A1 is applied in a high voltage to the memory reading circuit 17, and information stored in the flash /OTP identification memory circuit 1 is read onto the data bus 120. If the read data is "0", that nonvolatile semiconductor memory device is identified as an OTPROM. If the read data is "1", that memory device is identified as a flash memory.

After the identification of the type of the memory device in the step S114, a blank check test is carried out on the memory device identified as the OTPROM in order to verify that all the memory cells are erased. The product determined to be pass under the blank check test is put on the market as the OTPROM (a step S116).

On the other hand, the memory device identified as the flash memory undergoes various tests after being accommodated in the package, i.e., tests of a checking of operations by various pattern data writings, an erasing characteristic, a writing characteristic, a reading characteristic and the like. After that, products determined to be pass are put on the market as the flash memories (a step S118).

As described above, by use of the nonvolatile semiconductor memory device as the OTPROM, which is determined to be fail due merely to the presence of the over-erased memory cell, the number of nonvolatile semiconductor memory devices which are to be disposed as defective products can be substantially decreased.

A normal OTPROM is a memory device which has lost an ultraviolet ray erasing performance due to accommodation in a plastic package having no expensive ultraviolet ray transmission window for an ultraviolet ray erasing type EPROM (Electrically Programmable Read Only Memory). This OTPROM is widely utilized as an inexpensive memory device for practical use in an application in which it is almost unnecessary to rewrite data that is once programmed.

When this memory device of the invention is utilized as a flash memory, erasing and writing are carried out under control by the instruction port controller 2. When programming is carried out in the memory device recovered as an OTPROM, the instruction port controller 2 is brought into an operation inhibited state by storage data (data "0") of the flash /OTP identification memory circuit 1. In this case, the address latch 10 and the data latch 15 are in a through state in which the latches 10 and 15 allow applied data to pass intactly therethrough. In this state, the flash /OTP Vpp switching circuit 3 selects an applied high voltage vpp and applies the same to the X decoder 12 and the Y decoder 11. The data latch 15 is supplied with the high voltage Vpp. Accordingly, in this case, data programming is carried out in accordance with applied address bits A0-Am and write data from the input/output buffer 6. In this OTPROM, only data writing or programming is carried out, and any program data is not checked. Adjustment between timings for the address bits A0-Am and for program data D0-D7 is made by an external control device.

In the case with the OTPROM, a 5 V voltage of an operation supply voltage Vcc level is applied to a high voltage Vpp application terminal. The instruction port controller 2 is rendered inoperable when this high voltage Vpp is 5 V. Accordingly, for data reading in the OTPROM, data of memory cells at addresses designated by the address bits A0-Am can be read onto the data bus 120 merely in accordance with the chip enable signal /CE and the output enable signal /OE under control by the chip enable/output enable logic circuit 8.

In the case with the flash memory, a reading instruction is supplied to the registers 235 and 237 of the instruction port controller 2. The instruction port controller 2 is responsively reset, and a data reading operation is executed under control by the signals /CE and /OE apart from control by the instruction port controller 2.

A description will now be made on detailed configurations of the flash /OTP identification memory circuit 1, the flash /OTP Vpp switching circuit 3 and the memory reading circuit 17.

Figure 3:
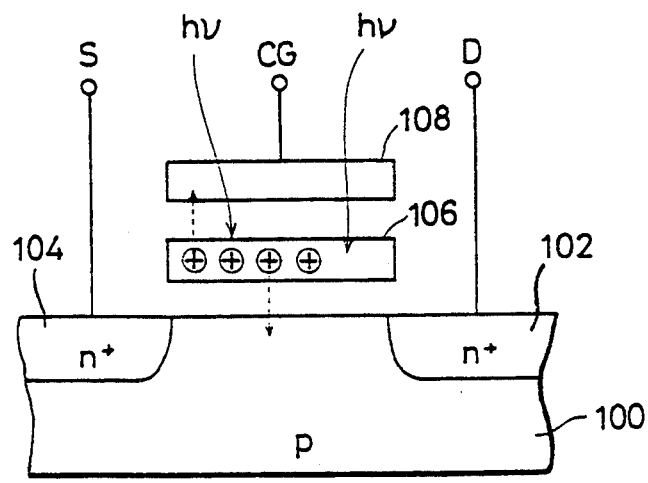
FIG. 3 is a diagram showing an example of a method for restoring an over-erased memory cell to an electrically neutral erase state in the present invention.

FIG. 3 is a diagram showing an example of a method for restoring an over-erased memory cell to a memory cell in an electrically neutral erase state. With reference to FIG. 3, an energy beam of, e.g., ultraviolet rays is directed to the entire memory cell array. A photon energy $\nu$ of this energy beam (ultraviolet rays) causes excitation of (excessive) positive charges present in a floating gate 106, and the excited positive charges move to a semiconductor substrate 100, a control gate 108 and the like. Accordingly, the floating gate 106 is restored to an electrically neutral state. This mechanism is very similar to that of erasing of EPROM with ultraviolet rays.

Figure 4:
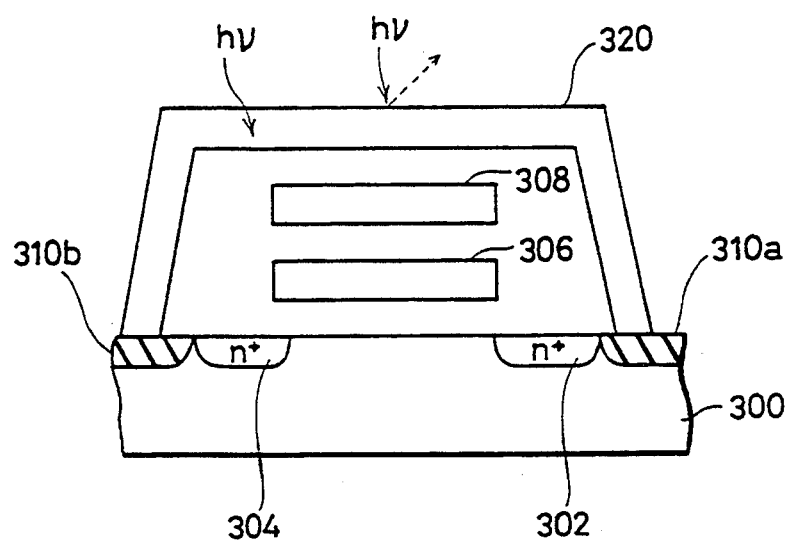
FIG. 4 is a diagram schematically showing structure of a UPROM cell included in a flash/OTP identifying memory circuit 1 shown in FIG. 1.

FIG. 4 is a cross-sectional view showing structure of a storage element for storing identification information, included in the flash /OTP identification memory circuit. With reference to FIG. 4, the storage element for storing flash /OTPROM identification information therein includes n type impurity regions 302 and 304 formed in a surface of a semiconductor substrate 300, a floating gate 306 formed on a channel region between the impurity regions 302 and 304, with an insulating film interposed between the floating gate and the channel region, and a control gate 308 formed on the floating gate 306 with an interlayer insulating film interposed therebetween. This structure has the same structure as that of a flash memory cell formed in a memory cell array.

This storage element further includes field insulating films 310a and 310b for defining a memory cell region, and an ultraviolet ray shielding layer 320 made of, e.g., aluminum which is formed to cover the control gate 308, the floating gate 306 and the impurity regions 302 and 304. While this ultraviolet ray shielding layer 320 is shown as contacting the field insulating films 310a and 310b in FIG. 4, any other structure for preventing the energy beam (ultraviolet rays) from being irradiated to the floating gate 306 may be employed.

The structure of the storage element of FIG. 4 is known as a UPROM (Unerasable Programmable ROM). The memory cell array portion is irradiated with an energy beam (ultraviolet rays) upon irradiation with the energy beam. In this case, the energy beam (ultraviolet rays) is directed to not only the memory cell array portion but also other peripheral circuit regions. By use of the structure of the storage element shown in FIG. 4, the irradiated energy beam is absorbed or reflected by the energy beam shielding layer 320, and electrons stored in the floating gate 306 do not receive energy from the irradiated energy beam. Accordingly, this storage element stably and unchangedly stores the storage information therein.

Figure 5:
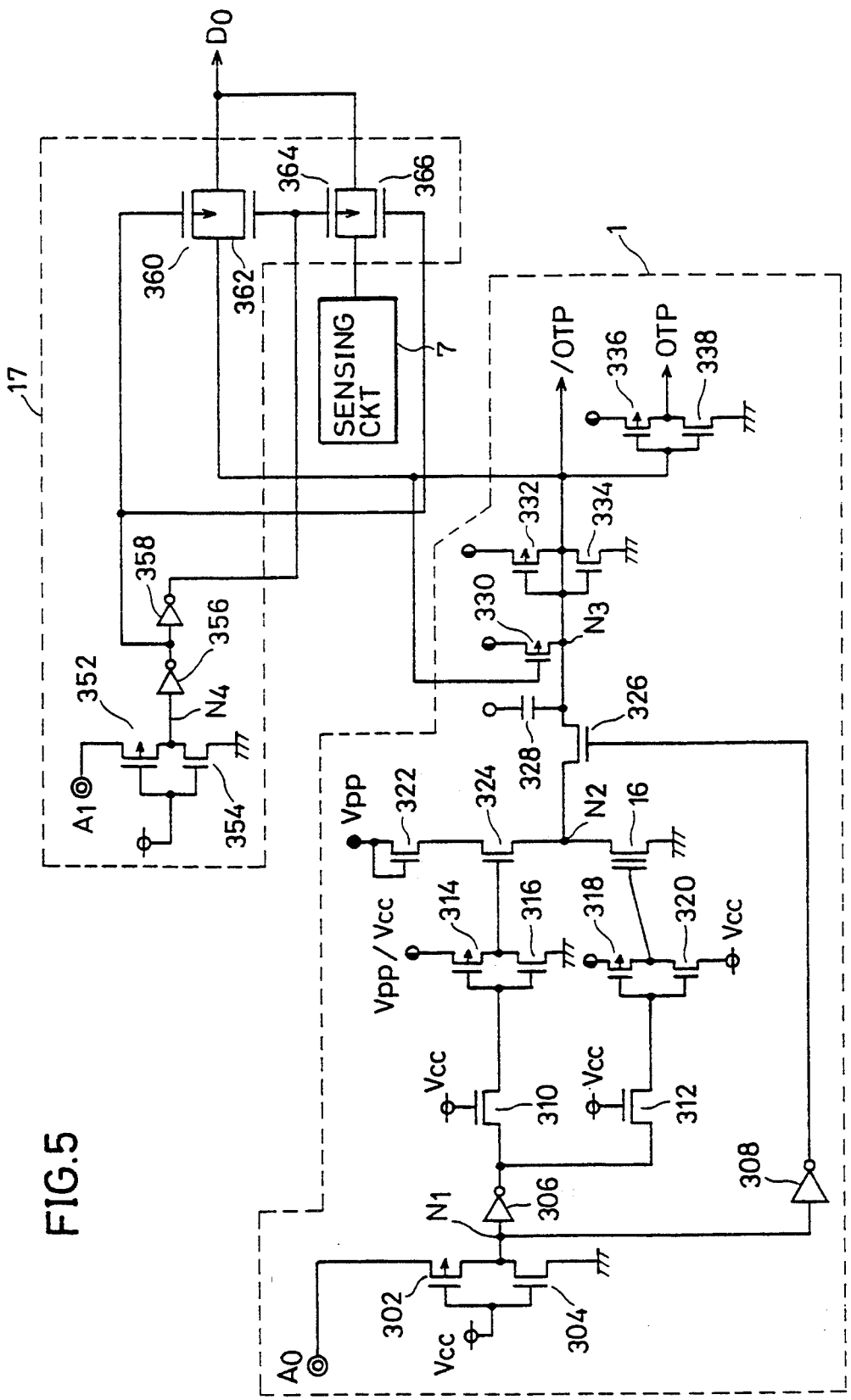
FIG. 5 is a diagram showing a specific example of structure of the flash/OTP identifying memory circuit and a memory reading circuit shown in FIG. 1.

FIG. 5 is a diagram showing a detailed structure of the flash /OTP identification memory circuit and the memory reading circuit shown in FIG. 1. With reference to FIG. 5, the flash /OTP identification memory circuit 1 includes a p channel MOS transistor 302 for receiving an address signal bit A0 at its one conduction terminal and a supply voltage Vcc at its gate, and having the other conduction terminal connected to a node N1, an n channel MOS transistor 304 having its one conduction terminal connected to a ground potential and the other conduction terminal connected to the node N1, and a gate connected to receive an operation supply voltage Vcc, and inverter circuits 306 and 308 for receiving a potential on the node N1. The inverter circuits 306 and 308 are provided in parallel with each other. The transistor 304 is normally in an ON state, while the transistor 302 is rendered conductive when the address bit A0 attains a level of a voltage higher than the supply voltage Vcc.

The identification memory circuit 1 further includes an n channel MOS transistor 310 for receiving a supply voltage Vcc at its gate and allowing an output of the inverter circuit 306 to pass therethrough, a p channel MOS transistor 314 and an n channel MOS transistor 316 connected complementarily between an output of a Vpp/Vcc switch 21 (see FIG. 1) and a ground potential and receiving an output voltage of the transistor 310 at their gates, an n channel MOS transistor 312 provided in parallel with the transistor 310 and receiving the supply voltage Vcc at its gate to allow an output of the inverter circuit 306 to pass therethrough, a p channel MOS transistor 318 and an n channel MOS transistor 320 connected complementarily between an output node of the Vpp/Vcc switch 21 and the supply voltage Vcc and receiving an output of the transistor 312 at their gates. The transistors 310 and 312 each are normally in an ON state and serve as a register or a decoupling transistor. When a high voltage Vpp is applied to one conduction terminal of each of the transistors 314 and 318 and their gate potentials rise above an operation supply voltage level by capacitive coupling, the transistors 310 and 312 are turned off and serve to prevent the applied high voltage from adversely affecting the inverter circuit 306.

The identification memory circuit 1 further includes an n channel MOS transistor 322 which is resistance-connected and serves as load means coupled to receive a high voltage Vpp from the external pin terminal for VPP, an n channel MOS transistor 324 for receiving an output of the transistor 322 at its one conduction terminal and receiving an output of an inverter circuit comprised of the transistors 314 and 316 at its gate, and a UPROM cell 16 provided between a node N2 and the ground potential, for receiving output voltages of the transistors 318 and 320 at its gate and storing flash /OTPROM identification information in a nonvolatile manner. This UPROM cell 16 has the structure shown in FIG. 4.

The identification memory circuit 1 further includes an n channel MOS transistor 326 for receiving an output of the inverter circuit 308 at its gate and selectively connecting nodes N2 and N3, a capacitor 328 for setting a potential level of the node N3 to a high level by its capacitive coupling upon application of power, p channel MOS transistors 332 and 334 complementarily connected between a Vpp/Vcc transmission node and the ground potential, for receiving a potential of the node N3 at their gates, a p channel MOS transistor 336 and an n channel MOS transistor 338 connected complementarily between the Vpp/Vcc transmission node and the ground potential, for receiving an output of a circuit comprised of the transistors 332 and 334 at their gates, and a p channel MOS transistor 330 for receiving the output of the circuit comprised of the transistors 332 and 334 at its gate and setting the potential on the node N3 selectively at the level of Vpp/Vcc.

The transistor 330 has a function of setting the potential on the node N3 in accordance with the output of the circuit comprised of the transistors 332 and 334 to stabilize an operation of this circuit. An identification signal /OTP is output from the circuit comprised of the transistors 332 and 334, while an identification signal OTP is output from a circuit comprised of the transistors 336 and 338. When the signal /OTP is at a low level, this memory device is identified as functioning as an OTPROM. The signals /OTP and OTP are applied to the instruction port controller 2 (precisely the WE·CE control logic circuit 231 shown in FIG. 13), so as to selectively set the operation of the instruction port controller 2 in a reset state (inoperable state). An operation of the identification memory circuit 1 will now be described.

When power is supplied or when the address bit A0 is at a level not higher than a supply voltage Vcc level, the potential on the node N1 is at a low level, the outputs of the inverter circuits 306 and 308 are at a high level, and the level of the potential on the node N3 is a high level because of the capacitor 328. The level of the potential on the node N2 is a low level since the transistor 324 is in an OFF state, and the UPROM cell 16 is initially in an erase state and is turned on by receiving a supply voltage Vcc at its gate via the transistor 320. In the initial state, charges injected by the capacitor 328 are discharged through the UPROM cell 16 to the ground, so that the node N3 is at a low level, the signal /OTP is at a high level and the signal OTP is at a low level.

When an over-erased memory cell is present in this memory device and irradiation with an energy beam (ultraviolet rays) is required, data "0" is written into the UPROM cell 16. That is, the address bit A0 is set at a high voltage level of approximately 10 V. Responsively, the transistor 302 is turned on, the potential level of the node N1 becomes a voltage level which is determined by the ratio of ON resistances of the transistors 302 and 304, and the potential level of the node N1 becomes a potential level which is determined to be a high level by the inverter circuits 306 and 308. Accordingly, the outputs of the inverter circuits 306 and 308 attain a low level, so that the transistor 326 is turned off.

In response to a signal of a low level from the inverter circuit 306, the transistors 314 and 318 are turned on and the transistors 316 and 320 are turned off. Accordingly, a high voltage Vpp is applied to the gate of the transistor 324 and also to the control gate of the UPROM cell 16. The high voltage Vpp is applied via the transistors 322 and 324 to the node N2. Accordingly, the potentials of the control gate and the drain (node N2) of the UPROM cell 16 attain a high voltage level, electrons are injected into the floating gate, a threshold voltage of the UPROM cell 16 shifts in a positive direction, so that data "0" is written.

With the writing of data "0" into the UPROM cell 16 completed, the high voltage level of the address bit A0 is returned to a low level. The potential on the node N1 attains a low level in accordance with the high voltage level returned to the low level, so that the transistors 314 and 318 are turned off and the transistors 316 and 320 are turned on. A supply voltage Vcc is applied via the transistor 320 to the control gate of the UPROM cell 16. When data "0" is written, the UPROM cell 16 remains in the OFF state irrespective of the potential applied to the control gate.

After the data is written into the UPROM cell 16 of the identification memory circuit 1, the irradiation with the energy beam (ultraviolet rays) is carried out, and thereafter assembly is made. Information stored in the UPROM cell 16 is maintained irrespective of the irradiation with the energy beam (ultraviolet rays). The potential level of the node N2 is set to a high level by the capacitor 328 when the UPROM cell 16 stores data "0" therein. When the UPROM cell 16 stores data "1" therein and indicates that the memory device serves as a flash memory, the potential level of the node N2 becomes a low level because the cell 16 is normally turned on. The potential level of the node N2 is transmitted via the node N3 and the transistors 332, 334, 336 and 338 and output as the signals /OTP and OTP. Accordingly, the levels of the signals /OTP and OTP are determined depending on the type of the flash memory /OTPROM. When the signal /OTP is at a low level and the memory device is operative as the OTPROM, the operation of the instruction port controller 2 is prohibited.

In a normal operation, since a voltage of, at maximum, supply voltage Vcc level is applied to the address bit A0, the transistor 302 is constantly OFF and the potential levels of the nodes N2 and N3 surely become values corresponding to the information stored in the UPROM cell 16.

A description will now be made on a structure for reading outside the device the storage information of the UPROM cell 16 for identifying whether this memory device is a flash memory or OTPROM. The reading of the identification information is carried out by the memory reading circuit 17 shown in FIGS. 1 and 5.

Referring again to FIG. 5, the memory reading circuit 17 includes a p channel MOS transistor 352 for receiving an address bit A1 at its one conduction terminal and a supply voltage Vcc at its gate, and an n channel MOS transistor 354 having its one conduction terminal connected to a ground potential and receiving an operation supply voltage Vcc at its gate. The other conduction terminal of each of the transistors 352 and 354 is connected to the node N4.

The memory reading circuit 17 further includes cascade-connected inverter circuits 356 and 358 of two stages for receiving the potential on the node N4, a p channel MOS transistor 360 and an n channel MOS transistor 362 responsive to outputs of the inverter circuits 356 and 358 for selectively allowing the identification signal /OTP to pass therethrough, and a p channel MOS transistor 364 and an n channel MOS transistor 366 responsive to the outputs of the inverter circuits 356 and 358 for transmitting data read by the sensing circuit 7. The transistors 360 and 362 are connected in parallel and constitute a transmission gate, while the transistors 364 and 366 are connected in parallel and constitute a transmission gate. The transistors 360 and 366 receive the output of the inverter circuit 356 at their gates, while the transistors 362 and 364 receive the output of the inverter circuit 358 at their gates. An operation will now be described.

After assembly, reading of the information stored in the identification memory circuit 1 is carried out in order to identify the type of this memory device. In this identification memory reading mode, a high voltage higher than the supply voltage Vcc is applied to the address bit A1. Responsively, the transistor 352 is turned on, so that the potential on the node N4 attains a high level. Thus, the output of the inverter circuit 356 attains a low level and the output of the inverter circuit 358 attains a high level, so that the transistors 360 and 362 are turned on and the transistors 364 and 366 are turned off. The identification signal /OTP from the identification memory circuit 1 is output as a data bit D0 via the transistors 360 and 362 in the ON state. By viewing the high level/low level of this signal /OTP, it is possible to identify whether this memory device is an OTPROM or a flash memory and then to determine a subsequent test sequence.

In a normal operation, the potential level of the address bit A1 is a supply voltage Vcc level at maximum, and the transistor 352 is constantly OFF. In this case, the transistors 364 and 366 are turned on and transistors 360 and 362 are turned off, so that the data sensed by the sensing circuit 7 is output as the data bit D0.

In the structure of the memory reading circuit shown in FIG. 5, it is represented that the outputs of the transistors 360, 362, 364 and 366 constituting the transmission gate are output as the data bit D0. The transistors 360, 362, 364 and 366 may be provided at an output stage of the input/output buffer 6 shown in FIG. 1, or alternatively, they may be provided at an input stage of the output buffer of the input/output buffer 6. Any structure may be applied, provided that the data read from the sensing circuit 7 and the identification signal /OTP are selectively output to the outside of the device.

Figure 6:
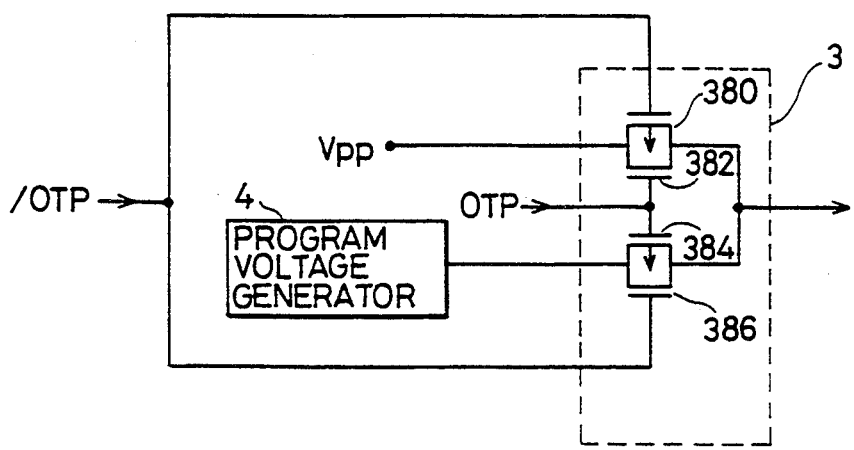
FIG. 6 is a diagram showing a specific structure of a flash/OTP Vpp switching circuit shown in FIG. 1.

FIG. 6 is a diagram showing structure of the flash /OTP Vpp switching circuit 3 shown in FIG. 1. With reference to FIG. 6, the flash /OTP Vpp switching circuit 3 includes a p channel MOS transistor 380 for receiving an identification signal /OTP at its gate, an n channel MOS transistor 382 provided in parallel with the transistor 380 and receiving an identification signal OTP at its gate, an n channel MOS transistor 386 for receiving the identification signal /OTP at its gate, and a p channel MOS transistor 384 provided in parallel with the transistor 386 and receiving the identification signal OTP at its gate.

The transistors 380 and 382 constitute one transmission gate and allow passage of an externally applied high voltage Vpp. The transistors 384 and 386 constitute the other transmission gate and allow passage of a program voltage generated from the program voltage generator 4. An output of the Vpp switching circuit 3 is applied to the X decoder 12 and the Y decoder 11 shown in FIG. 1. This output may be applied also to the data latch 15.

In operation, when the device serves as the flash memory, the identification signals /OTP and OTP are at a high level and a low level, respectively, so that the transistors 384 and 386 are turned on and the transistors 380 and 382 are turned off. Accordingly, the program voltage generated from the program voltage generator 4 is selected and transmitted to each necessary circuit.

When the device is operative as the OTPROM, the identification signals /OTP and OTP are at a low level and a high level, respectively, so that the transistors 380 and 382 are turned on and the transistors 384 and 386 are turned off. Accordingly, the externally applied high voltage Vpp is transmitted as a program voltage to each circuit. With this structure, when the device functions as the OTPROM, even if the operation of the instruction port controller 2 is prohibited, the external high voltage Vpp is transmitted to each necessary circuit, thereby facilitating data programming.

Figure 7:
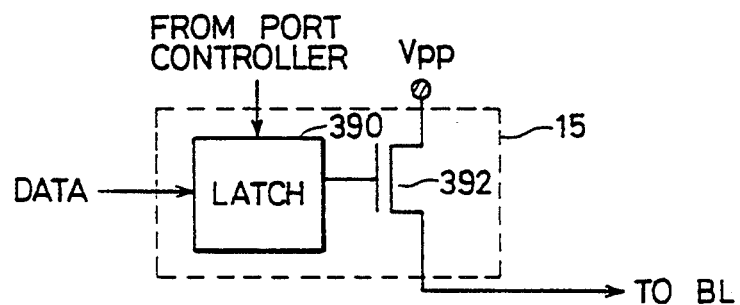
FIG. 7 is a diagram schematically showing structure of a data latch shown in FIG. 1.

FIG. 7 is a diagram showing structure of a portion of one bit in the data latch 15 shown in FIG. 1. With reference to FIG. 7, the data latch 15 includes a latch circuit 390 for latching data applied from the input/output buffer 6 in response to a strobe signal from the instruction port controller 2, and an n channel MOS transistor 392 for transmitting a high voltage Vpp via the Y gate circuit 14 onto a corresponding bit line BL in response to an output of the latch circuit 390. When input data is "0", the latch circuit 390 outputs a signal of a high level. This structure is easily implemented by constituting the latch circuit 390 by an inverter latch. That is, when the input data is "0", the output of the latch circuit 390 attains a high level and the transistor 392 is turned on.

The transistor 392 boosts a gate potential by capacitive coupling between its gate and its drain (a self-boot-strap function). This allows a high voltage Vpp to be transmitted onto a bit line BL. In the case with the flash memory, the latch operation of the latch circuit 390 is controlled by a signal from the instruction port controller 2. On the other hand, in the case with the OTPROM, the latch circuit 390 does not carry out a latch operation, and transmits input data to the gate of the transistor 392 without latching the input data therein.

Figure 8:
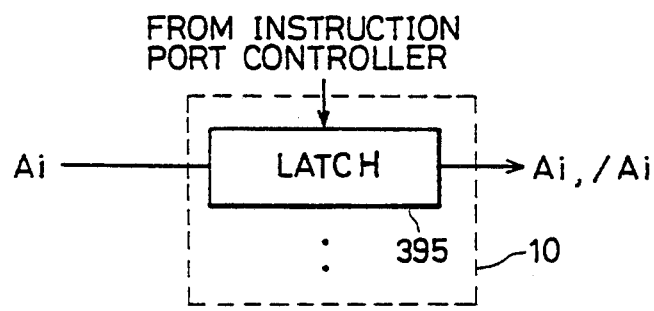
FIG. 8 is a diagram showing a specific structure of an address latch shown in FIG. 1.
Figure 9:
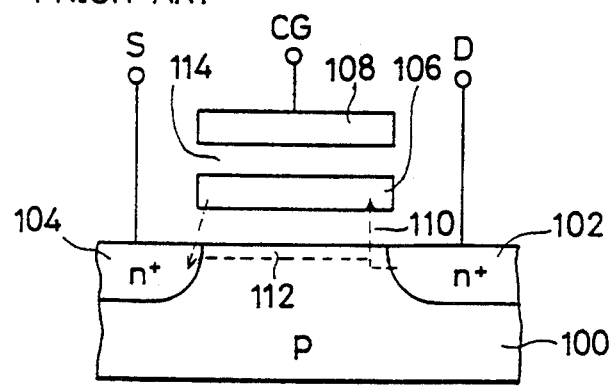
FIG. 9 is a diagram schematically showing structure of a flash memory cell comprised of a floating gate transistor.
Figure 10:
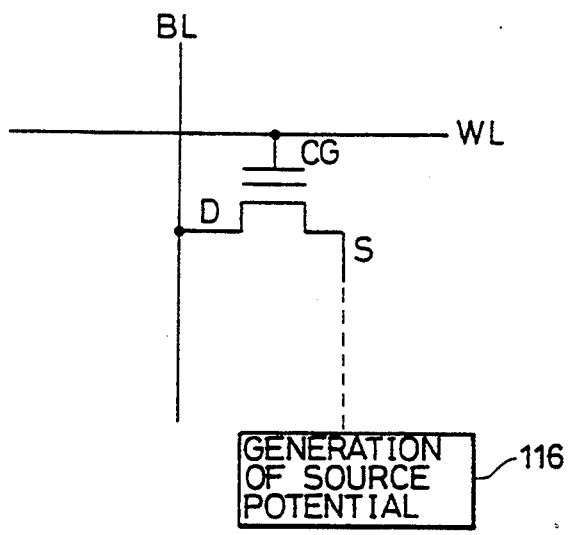
FIG. 10 is a diagram showing an electrically equivalent circuit of the flash memory cell shown in FIG. 9.
Figure 11:
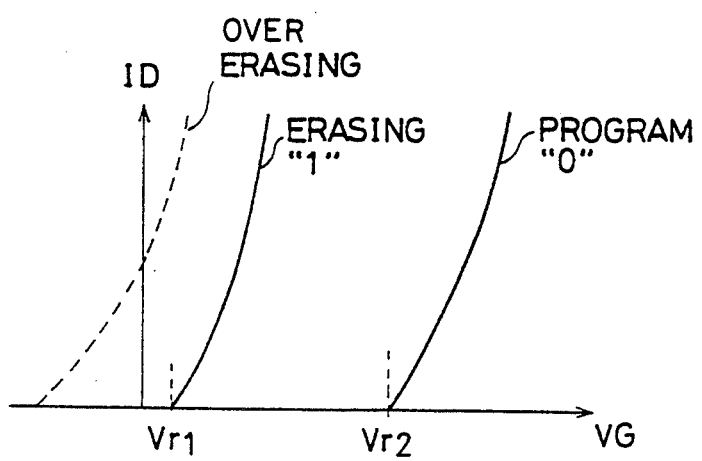
FIG. 11 is a diagram showing a relationship between storage information and a threshold voltage of the flash memory cell.

FIG. 8 is a block diagram showing structure of the address latch 10 shown in FIG. 1. With reference to FIG. 8, the address latch 10 includes a latch circuit 395 for latching an address bit Ai (any of A0-Am) in response to a strobe signal from the instruction port controller 2 to generate internal address bits Ai and /Ai. When the memory device is operative as the flash memory, this latch circuit 395 carries out a latch operation and generates the internal address bits Ai and /Ai at predetermined timing. When the memory device is operative as the OTPROM, the latch circuit 395 does not carry out a latch operation, but the circuit 395 is brought into a through state and generates the internal address bits Ai and /Ai from the applied address bit Ai. Thus, the internal address bits Ai and /Ai also change with a change of the input address bit Ai.

When the memory device is subjected to programming as the OTPROM, the X decoder 12 and the Y decoder 11 carry out a decoding operation in accordance with the change of the applied address bits A0-Am, so that data is written into a corresponding addressed memory cell.

In the foregoing embodiment, the instruction port controller 2 accepts the data from the input/output buffer 6 via the bus 123a as an instruction command and carries out a necessary control operation on the basis of a combination of the states of the external control signals /CE and /WE. The present invention is applicable not only to the nonvolatile semiconductor memory device including such an instruction port controller 2 but also any nonvolatile semiconductor memory device including one floating gate transistor as a memory cell. In addition, a bit width of input/output data is not limited to one byte, and another bit width may be employed.

Moreover, in an erasing operation, the same effects as those provided in the foregoing embodiment can be obtained even in a structure in which not every memory cell is erased at the same time but only memory cells to be programmed are erased. That is, the same effects as those provided in the foregoing embodiment can be obtained even in a nonvolatile semiconductor memory device in which data erasing is carried out in the units of word line, the units of byte or the units of sector.

As has been described heretofore, according to the present invention, it is made possible to utilize the nonvolatile semiconductor memory device, which is determined as fail because of an over-erased memory cell, as a one-time programmable read only memory device and therefore significantly reduce the number of memory devices to be disposed as fail products.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device including an array in which a plurality of memory cells each comprised of a floating gate type transistor are arranged, comprising:
   memory type storage means for storing information indicating whether an electrically over-erased memory cell present in said array is brought into an erase state or not by irradiation with an energy beam;
   program control means for controlling an erasing and writing operation of data on a selected memory cell in said array; and
   memory type setting means responsive to the information of said memory type storage means for setting the operation of said program control means in either an operation prohibited state or an operable state.

2. The nonvolatile semiconductor memory device as recited in claim 1, further comprising:
   reading means for reading the information stored in said memory type storage means in response to a signal for instructing reading of memory type information in said storage means.

3. The nonvolatile semiconductor memory device according to claim 2, wherein said reading means includes:
   first transfer means for transferring the information in said storage means supplied through said memory type setting means,
   second transfer means for transferring data read out from a selected memory cell in said array, and
   data control means responsive to said signal for instructing, for enabling said first transfer means and disabling said second transfer means.

4. The nonvolatile semiconductor memory device according to claim 3, wherein said reading means includes;
   an address node for receiving said signal for instructing,
   logic gate means including p channel field effect transistor and n channel field effect transistor complementarily connected between said address node and a ground potential and receiving a power supply potential at their gates, for generating an internal control signal in response to the signal for instructing, and
   means responsive to said internal control signal for controlling enabling and disabling of said first and second transfer means.

5. The nonvolatile semiconductor memory device according to claim 1, wherein said memory type storage means includes an unerasable programmable read only memory element.

6. The nonvolatile semiconductor memory device according to claim 1, wherein said memory type storage means includes:
   an unerasable programmable read only memory element including a floating gate type transistor having a control gate and a conduction terminal and a shield layer for preventing irradiation of said energy beam to said transistor,
   means responsive to an instruction of writing data, for generating an internal write instruction signal, and
   writing means responsive to said internal write instruction signal, for generating and applying to said control gate and said conduction terminal voltages sufficient for causing carrier injection into the floating gate.

7. The nonvolatile semiconductor memory device according to claim 1, wherein said memory type storage means includes an unerasable programmable read only memory element of a floating gate type transistor having a control gate and a conduction terminal, and wherein said memory type setting means includes:
   means for normally generating a selection instructing signal,
   means responsive to said selection instructing signal for applying a selecting voltage to said control gate for bringing said memory element into a selected state, means responsive to said selection instructing signal for connecting said conduction terminal to a first node, means responsive to power-on of a power supply of the nonvolatile semiconductor memory device, for resetting said first node to a predetermined potential level, and means responsive to a potential at said first node for generating a control signal for controlling an operation state of said program control means.

8. The nonvolatile semiconductor memory device according to claim 1, wherein said memory type storage means includes an unerasable programmable read only memory element of a floating gate type transistor including a control gate, a floating gate and a conduction terminal, and wherein said memory type setting means and said memory type setting means shares:

first circuit means including p channel field effect transistor and n channel field effect transistor complementarily connected between an address input node and a ground potential and receiving a power supply potential at their gates, second circuit means including p channel field effect transistor and n channel field effect transistor complementarily connected between the ground potential and a first supply line receiving either a programming high potential (Vpp) on the power supply potential, for generating an output corresponding to an output of the first circuit means, third circuit means including p channel field effect transistor and n channel field effect transistor complementarily connected between the first supply line and the power supply potential, for generating either of the programming high potential and the power supply potential in response to the output of said first circuit means to apply the generated potential to said control gate of the memory element, resistance means for receiving and lowering the programming high potential, transfer gate of a field effect transistor responsive to an output of said second circuit means, for transmitting a potential received through the resistance means to the conduction terminal of the memory element, and transmission gate means including a field effect transistor, for connecting the one conduction terminal of said memory element to a first internal node, and wherein said memory setting means further includes:

reset means responsive to power-on of said power supply potential for resetting the first internal node to an initial potential, and means responsive to a signal potential at said first internal node for generating a signal indicating the type of said nonvolatile semiconductor device as well as a signal for determining an operation state of said program control means.

* * * * *